United States Patent [19]

Baier et al.

[11] Patent Number: 4,852,595

[45] Date of Patent: Aug. 1, 1989

[54] MACHINE FOR ETCHING OBJECTS

[75] Inventors: Dietfried Baier, Herrenberg; Ivan Grasa, Gäufelden; Rainer Haas, Herrenberg, all of Fed. Rep. of Germany

[73] Assignee: Hans Hollmuller Maschinenbau GmbH & Co, Herrenberg, Fed. Rep. of Germany

[21] Appl. No.: 193,058

[22] Filed: May 12, 1988

[30] Foreign Application Priority Data

Mar. 5, 1988 [DE] Fed. Rep. of Germany ....... 3807261

[51] Int. Cl.$^4$ ................................................ B08B 3/02
[52] U.S. Cl. .................................... 134/144; 134/181; 239/263.1; 239/263.3
[58] Field of Search .......................... 239/263.1, 263.3; 134/144, 145, 172, 180, 181

[56] References Cited

U.S. PATENT DOCUMENTS 3,955,588  5/1976  Born ................................. 134/172 X

FOREIGN PATENT DOCUMENTS 1203630 10/1965 Fed. Rep. of Germany ...... 134/144
1428359 11/1968 Fed. Rep. of Germany ...... 134/181
3345124  6/1985 Fed. Rep. of Germany ...... 134/144
 700563 11/1979 U.S.S.R. ............................. 134/172

Primary Examiner—Philip R. Coe
Attorney, Agent, or Firm—Fred Philpitt

[57] ABSTRACT

In a machine for etching objects, a nozzle assembly carries out an oscillating movement transverse to the conveying direction, in which the objects to be etched are guided through the machine. The device, which produces the oscillating movement, comprises a drive motor, whereof the rotary movement is converted by means of a cam disc into the oscillating movement of the nozzle assembly. The cam disc, on whose outer contour pressure engagement members of the nozzle assembly bear against two diametrically opposed points, has the contour of a cardioid. Due to this, a particularly linear displacement-time characteristic of the oscillation movement between the reversing points is achieved, which contributes to making the etching process more uniform.

4 Claims, 4 Drawing Sheets

MACHINE FOR ETCHING OBJECTS

The invention relates to a machine for etching objects, in particular for the production of plates for electronic circuits, with
(a) a housing;
(b) at least one nozzle assembly, on which a plurality of nozzles is arranged, from which the objects are sprayed in a specific spray pattern with liquid etching medium;
(c) a conveying device, which guides the objects continuously through the spray pattern formed by the liquid etching medium;
(d) an oscillation device, which sets the nozzle assembly in an oscillating movement transverse to the conveying direction and comprises a drive motor, whereof the rotary movement is converted into the oscillating movement of the nozzle assembly.

Owing to the tendency towards miniaturization, the circuit patterns, which are to be produced on plates for electronic circuits, have increasingly small dimensions. This makes increasingly higher demands on the uniformity of the etching process, since otherwise locally incomplete etching or even under-etching of the conductor structure may occur. For this reason, in machines of the afore-mentioned type, oscillation devices were already used hitherto, which set the nozzle assembly in a reciprocating (oscillating) movement. It was thus intended to prevent irregularities contained in the spray pattern of the liquid etching medium produced by the nozzle assembly from always striking the same regions of the objects to be etched. This would namely lead to corresponding irregularities in the etching operation. The irregularities in the spray pattern are "obliterated" by the oscillating movement of the nozzle assembly and the etching process is made uniform.

In known machines of the afore-mentioned type, the oscillating movement of the nozzle assembly was produced by a crank drive, which converted the rotary movement of a drive motor into the desired reciprocating movement of the nozzle assembly. In this method of construction, the displacement-time diagram of the oscillation movement is sinusoidal. In the region of the reversing points, the nozzle assembly has a considerably longer dwell period than at the passing points in the center between the two reversing points. Thus, in this region, as before, irregularities of the spray pattern may result in non-uniformity of the etching process.

It is the object of the present invention to develop a machine of the afore-mentioned type so that even more uniform etching can be achieved.

This object is achieved according to the invention due to the fact that
(e) for converting the rotary movement of the drive motor into the oscillating movement of the nozzle assembly, a cam disc is provided, which is set in rotation by the drive motor and whereof the effective outer contour has a heart shape;
(f) two pressure engagement members are connected to the nozzle assembly, which members rest at diametrically opposed points against the outer contour of the cam disc.

It is thus known per se from machine construction in another connection that the movement characteristic of oscillation movements can be linearised with heart-shaped curves of this type. However, according to the invention it is recognised for the first time that this fundamentally possible linearisation of the oscillation movement in etching machines of the afore-mentioned general type contributes to an improvement in the etching result. The range of movement, in which the speed of movement of the etching assembly is constant and thus the "obliteration" of irregularities in the spray pattern is particularly effective, is very much greater than in the known crank drives, namely when using the heart-shaped curve within the oscillation device. Solely in the immediate region of the reversing points, in order to avoid inadmissibly high accelerations and thus related high forces, the movement characteristic must be somewhat "rounded-off".

The pressure engagement members connected to the nozzles assembly are advantageously rollers. The ease of movement of the entire arrangement is improved herewith.

The pressure engagement members may thus be located on a support frame, to which the nozzle assembly is attached.

One embodiment of the invention is described in detail hereafter with reference to the drawings, in which.

Figure 1:
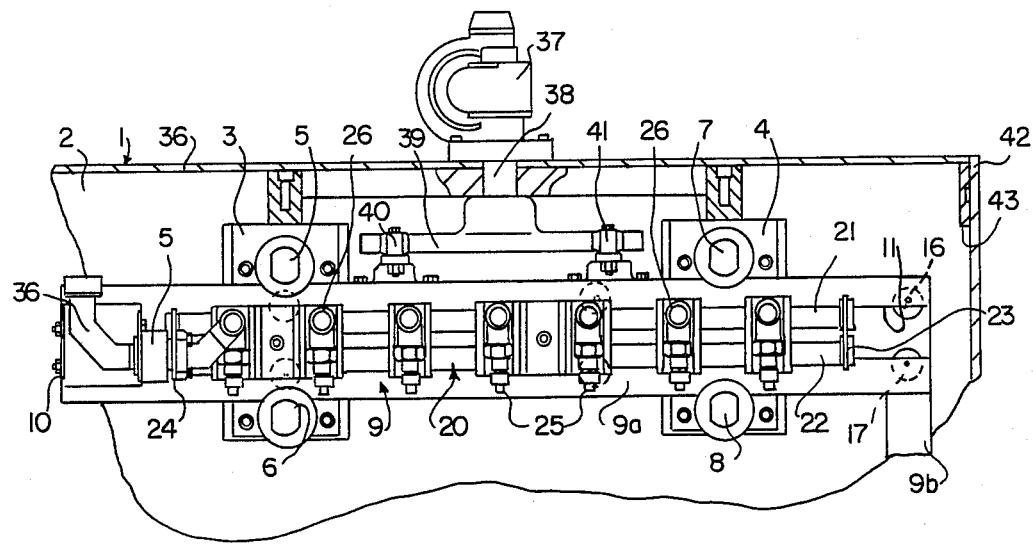
FIG. 1 is a partial section on line I—I of FIG. 2 through an etching machine, seen in the conveying direction, with the nozzle assembly inserted.

FIG. 1 is a vertical partial section through the upper region of an etching machine, seen in its conveying direction. Two bearing blocks 3, 4 are screwed to the side wall 2 of the housing 1 or a corresponding frame part, which is at the rear in the conveying direction. On each bearing block 3, 4, two rollers 5, 6 respectively 7, 8 are held in a rotary manner with a vertical spacing. The pairs of rollers 5, 6 respectively 7, 8 guide a support frame 9 able to move in the horizontal direction, which in the manner of a horizontal U is formed by an upper horizontal leg 9a, a vertical connecting leg 9b shown on the right in the drawing and a lower horizontal leg no longer shown in the drawing. The conditions in the region of the lower horizontal leg of the support frame 9 correspond completely to those in the illustrated upper region, so that it is possible to dispense with an explanation relating to this. The arrangement is clearly such that the entire support frame 9 with its two horizontal legs 9a and the connecting leg 9b can be moved towards the left and right in the view of FIGS. 1 to 4. As will be described in more detail hereafter, this degree of freedom is necessary for carrying out an oscillating movement of the nozzle assembly.

A corresponding support frame 9 is constructed on the side wall or corresponding frame part of the etching machine which is not shown in the drawing and is located at the front in the conveying direction. A separate description relating to this can also be dispensed with.

The two support frames 9 are connected to each other by a strut 10 extending parallel to the conveying direction of the etching machine, so that also in plan view, the two support frames and the strut 10 have the shape of a horizontal U, which is open towards the right hand side.

Figure 3:
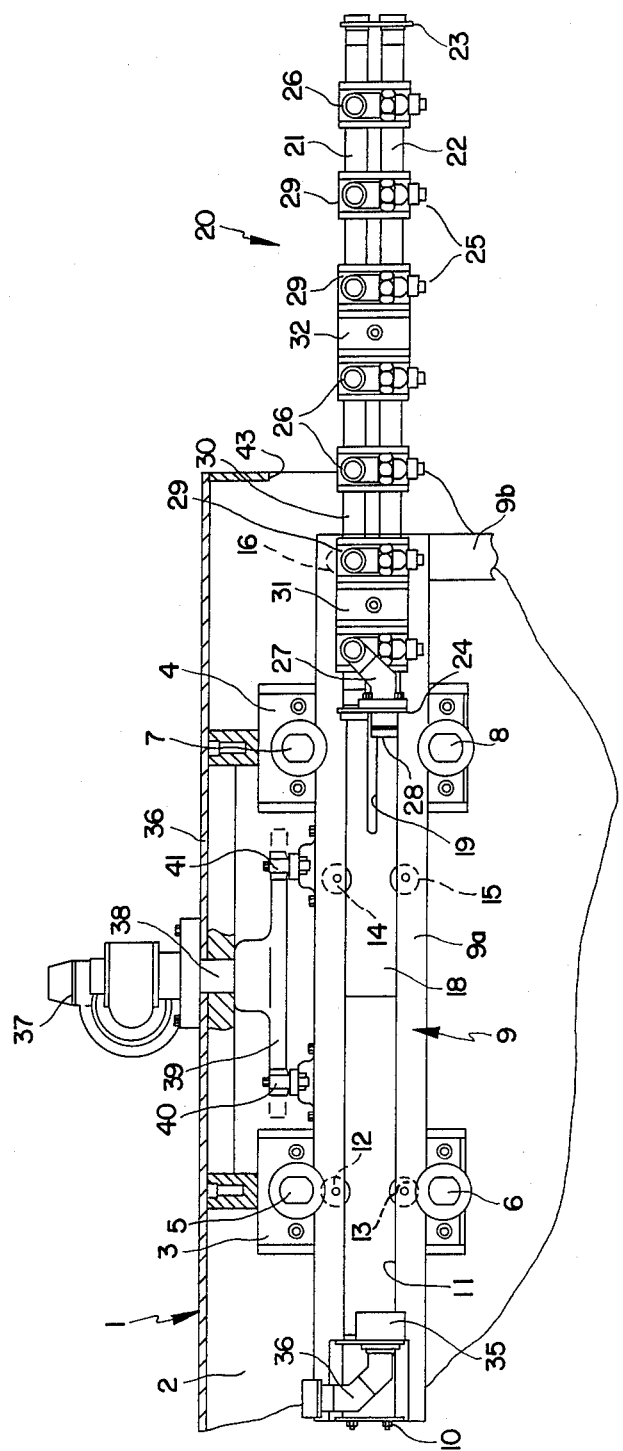
FIG. 3 is a partial section corresponding to FIG. 1, but with the nozzle assembly removed.

The horizontal legs 9a of the support frame 9 are respectively designed as sectional members with a longitudinal slot 11 opening towards the inside of the etching machine (see FIGS. 1 and 3). Six rollers 12 to 17 are mounted in the inside of the horizontal leg 9a, which rollers form three pairs of rollers. This can be seen particularly clearly in FIG. 3. Between the rollers 12 to 17, a rail 18 is guided to move in the horizontal direction, which rail is in the shape of a flat section placed on edge. Also the rail 18 extends within the cavity of the horizontal leg 9a of the support frame 9.

The rail 18 is in turn provided with a longitudinal slot 19 (see in particular FIG. 3), which serves for the movable mounting of a nozzle assembly, which is designated generally by the reference numeral 20.

The nozzle assembly 20 comprises a rigid retaining frame as the supporting member. At the front and rear side respectively in the conveying direction, this retaining frame comprises two parallel, horizontal support bars 21, 22 made of titanium and on the sides extending prallel to the conveying direction, respectively a connecting strut 23 or 24 of the same material. The retaining frame of the nozzle assembly 20 fixed by the support bars 21, 22 and the connecting struts 23, 24 is thus resistant to temperature and resistant to torsion so that no bending occurs even after a long operating time at higher temperatures.

A plurality of nozzles 25 is arranged in a regular pattern within the nozzle assembly 20. In the upper nozzle assembly 20 illustrated in the drawing, the nozzle aperture thus points respectively downwards onto the material to be etched moving at right angles to the plane of FIGS. 1 and 3, which in known manner is guided continuously through the etching machine by a conveying device which is not shown. In a corresponding manner, the etching nozzles on the lower nozzle assembly, which is not shown in the drawing, point upwards.

The nozzles 25 lying respectively in a row parallel to the conveying direction of the etching machine are connected to each other by way of a pipe 26 so that the etching medium is supplied to them collectively. Each pipe 26 is connected by way of a connecting pipe 27 extending at right angles to the conveying direction of the etching machine, to a plug-in coupling part 28 which is attached to the connecting strut 24 and by way of which the etching medium is supplied separately for each row of nozzles 25 located on a pipe 26 in a manner to be described hereafter. The plug-in coupling parts 28 can be seen particularly clearly in FIGS. 3 and 4.

The opposite ends of the pipes 26 carrying etching medium and consisting of synthetic material are held in sleeves 29, which are pushed over the support bars 21, 22 of the nozzle assembly 20. The sleeves 29 are kept at the correct spacing by tubular spacer members 30.

Figure 4:
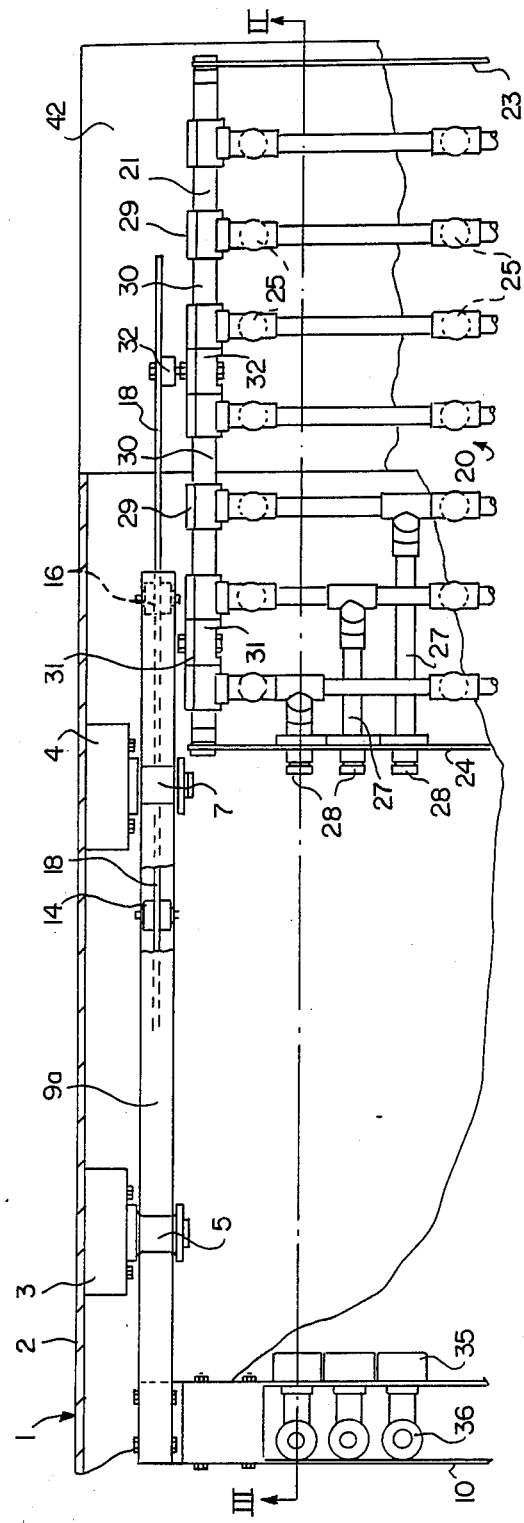
FIG. 4 is a plan view of the etching machine of FIG. 3, corresponding to FIG. 2, with the cover removed and the oscillation device removed.

At two points on the two opposite sides of the nozzle assembly 20, a spacer member is respectively replaced by a support sleeve 31, 32. Outwardly projecting sliding members 33, 34 of material having a low coefficient of friction are screwed to the support sleeves 31, 32, which sliding members 33, 34 engage in the longitudinal slot 19 in the rail 18. The arrangement is thus such that on the one hand the nozzle assembly 20 can be moved with respect to the rail 18, in which case the sliding members 33, 34 move within the longitudinal slot 19 and that in addition on account of its mounting between the rollers 13 to 17, the rail 18 is able to slide horizontally within the support frame 9. In this way, the nozzle assembly 20 is able to travel laterally out of the support frame 9 in a double telescopic manner, as is illustrated in FIGS. 3 and 4.

Figure 2:
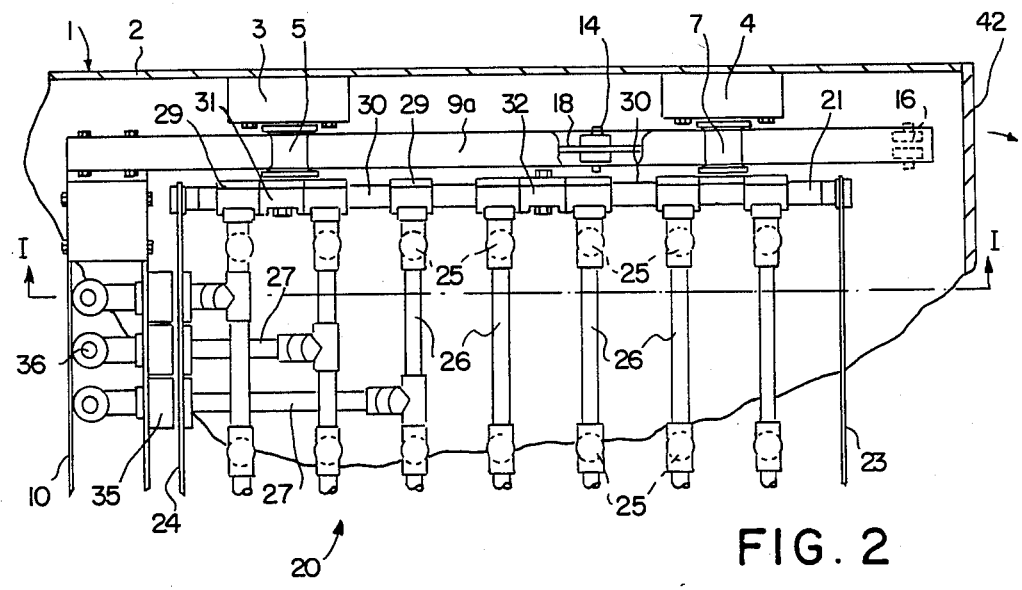
FIG. 2 is a plan view of the etching machine of FIG. 1 with the cover removed and the oscillation device removed.

In the inserted state of the nozzle assembly 20 illustrated in FIGS. 1 and 2, the plug-in coupling members 28, which are attached to the nozzle assembly 20, engage in complementary plug-in coupling members 35, which are located on the strut 10 of the support frame 9. The plug-in coupling members 35 are supplied with etching medium by way of pressure hoses which are not shown, which are attached to angle tubes 36 connected to the plug-in coupling members 35.

A geared motor 37 is mounted on the upwardly pointing wall 36 ("lid") of the etching machine. The output shaft 38 of the geared motor 37 passes in a sealed manner through the wall 36 and at its free end supports a cam disc 39. Two rollers 40, 41 screwed to the upper side of the horizontal leg 9a of the support frame 9 rest against diametrically opposed points on the outer periphery of the cam disc 39. The geared motor 37, cam disc 39 and rollers 40, 41 form an oscillating device, by which the nozzle assembly 20 can be set in a reciprocating motion.

Figure 5:
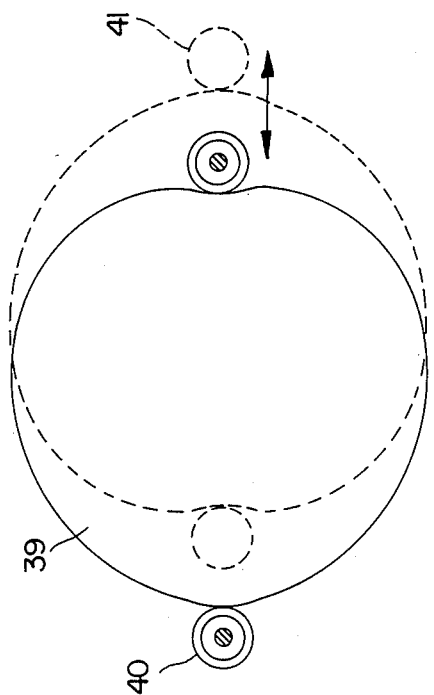
FIG. 5 is an underneath view of the cam disc, which is used in the oscillation device of the etching machine illustrated in FIGS. 1 to 4.

FIG. 5 is an underneath view of the cam disc 39 to an enlarged scale and indeed it is shown in two different rotary positions. The contour of the cam disc 39 is known in the machine construction as a so-called "cardioid".

During the rotation of the cam disc 39, which is brought about by the geared motor 37, the rollers 40, 41 resting on opposing points of the cam disc experience a reciprocating movement (oscillating movement), which is transmitted to the frame 9 and thus to the entire nozzle assembly 20.

The method of operation of the afore-described etching machine is as follows:

During normal operation, the nozzle assembly 20 is located in the inserted position, which is shown in FIGS. 1 and 2. This means that the plug-in coupling members 28 located on the connecting strut 24 of the nozzle assembly 20 engage in the plug-in coupling members 35 located on the strut 10 of the support frame 9; etching medium may thus flow by way of the plug-in coupling members 35, 28, the connecting pipes 27 and the pipes 26 to the nozzles 25 and emerge from the latter in a desired etching pattern. The objects to be etched are conveyed below the nozzle assembly 20 shown in FIG. 1, at the same time above the second nozzle assembly located therebelow and which is not shown, perpendicular to the plane of the drawing of FIG. 1. The lateral opening 43 of the housing, through which the nozzle assembly 20 can be moved into its maintenance position, is closed-off by a side wall 42 which can be swung down.

Figure 6:
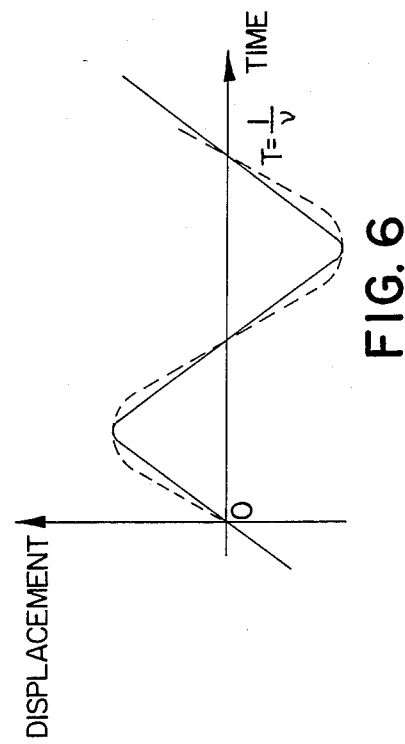
FIG. 6 is the displacement-time diagram of the oscillating movement of the nozzle assembly in the machine according to FIGS. 1 to 5.

The geared motor 37 sets the cam disc 39 in rotation. Due to the fact that the rollers 40 and 41 bear against the cam disc 39, the entire support frame 9 experiences an oscillating movement, the direction of which is at right angles to the conveying direction of the material to be etched. Irregularities in the spray pattern of the nozzles are compensated for by this oscillating movement, so that in the direction transverse to the conveying direction, there are thus no areas in which greater etching occurs than in other areas. Due to the construction of the cam disc 39 as a cardioid (see FIG. 5), the displacement-time diagram of the oscillating movement is substantially in the form of a saw-tooth, as shown in full line in FIG. 6. This means that the movement between the reversing points takes place at approximately constant speed, in which case at the reversing points themselves, a certain rounding-off of the displacement-time diagram is tolerated in order to avoid excessive acceleration forces. In FIG. 6, the displacement-time diagram of conventional crank drives for the oscillation movement is also shown in broken line, which is a sine curve. With this shape of the displacement-time diagram, an increased dwell period in the region of the maxima or minima of the sine curve occurs, so that at this point, despite the oscillatory movement of the nozzle assembly, etching is intensified. In view of the ever-increasing demands as regards uniform etching, considerable progress is achieved by the oscillation device operating with the cardioid as an eccentric.

If disturbances in the operation occur due to the fact that certain nozzles 25 become fouled and blocked or there is to be a change to a new material to be etched, the side wall 42 is folded down into the approximately horizontal position about an axis which extends parallel to the conveying direction on the lower longitudinal edge of the housing 1. In this way not only does it expose the side opening 43, in addition it simultaneously serves as a drip tray, in which etching medium dripping from the nozzle assembly 20 can be collected and can flow back into the etching medium sump.

The nozzle assembly 20 can now be drawn out laterally through the opening 43. In this case, first of all the sliding members 33, 34 move within the longitudinal slot 19 in the rail 18, until they abut against the end of the longitudinal slot 19. As the nozzle assembly 20 is drawn out further, the entire rail 18 now moves within the horizontal leg 9a of the support frame 9, in which case the rollers 12 to 17 ensure easy sliding and precise guidance.

The nozzle assembly 20 finally arrives in the position illustrated in FIGS. 3 and 4 above the side wall 42 which is folded downwards. In this case, the individual nozzles 25 are easily accessible and can be easily removed, cleaned, re-aligned or replaced.

After the conclusion of maintenance work, the nozzle assembly 20 is guided back into the position illustrated in FIGS. 1 and 2. The plug-in coupling members 28 engage in the plug-in coupling members 35, whereby the connection to the etching medium pump is produced. Finally, the nozzle assembly 20 is once again locked within the support frame 9 by a suitable device and the side wall 42 is folded up into its vertical position.

We claim:

1. A machine for etching objects, in particular for the production of plates for electronic circuits which includes
   (a) a housing (1),
   (b) at least one nozzle assembly (20) mounted within said housing, said assembly including a plurality of nozzles which are adapted to spray a liquid etching medium in a specific spray pattern,
   (c) means to guide the objects through the spray pattern formed by the liquid etching medium,
   (d) an oscillation device operatively connected to said nozzle assembly which sets the nozzle assembly in an oscillating movement, said oscillation device including a drive motor (37), having a rotary movement and a cam disc (39) operatively connected both to each other and to the nozzle assembly whereby rotary movement of the drive motor (37) is by means of the cam disc (39) converted into an oscillating movement of the nozzle assembly (20), said oscillating movement having an effective outer contour that is heart-shaped, and
   (e) two engagement members (40, 41) operatively connected to the nozzle assembly (20) and engageable with diametrically opposed points of the outer contour of said cam disc (39).

2. A machine according to claim 1 wherein said pressure engagement member (40, 41) are rollers.

3. A machine according to claim 1 wherein the shape of the cam disc (39) is cardioid.

4. A machine according to claim 1 wherein the pressure engagement members (40, 41) are arranged on a support frame (9) said support frame (9) being attached to said nozzle assembly (20).

* * * * *